(12) United States Patent
Yen

(10) Patent No.: US 9,419,034 B2
(45) Date of Patent: Aug. 16, 2016

(54) IMAGE SENSOR MODULE AND METHOD FOR ADJUSTING FOCUS OF IMAGE SENSOR MODULE

(71) Applicant: HIMAX TECHNOLOGIES LIMITED, Tainan (TW)

(72) Inventor: Yu-Feng Yen, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 173 days.

(21) Appl. No.: 14/248,350

(22) Filed: Apr. 9, 2014

(65) Prior Publication Data
US 2015/0295004 A1 Oct. 15, 2015

(51) Int. Cl.
*H01L 27/146* (2006.01)
*H04N 5/225* (2006.01)

(52) U.S. Cl.
CPC .... *H01L 27/14625* (2013.01); *H01L 27/14618* (2013.01); *H04N 5/2254* (2013.01); *H04N 5/2257* (2013.01); *H04N 5/2258* (2013.01)

(58) Field of Classification Search
CPC ............... H01L 27/14625; H01L 27/14618; H04N 5/2254; H04N 5/2257; H04N 5/2258
USPC .............................................. 250/208.1, 239
See application file for complete search history.

(56) References Cited

U.S. PATENT DOCUMENTS

| | | | | |
|---|---|---|---|---|
| 7,127,793 | B2* | 10/2006 | Misawa | H01L 27/14618 257/E31.118 |
| 7,697,217 | B2* | 4/2010 | Funahashi | G02B 15/177 359/696 |
| 8,498,060 | B2* | 7/2013 | Ito | G02B 7/021 359/694 |
| 2008/0174888 | A1* | 7/2008 | Azegami | G02B 7/102 359/823 |
| 2010/0059664 | A1* | 3/2010 | Aiba | G03B 17/00 250/238 |

FOREIGN PATENT DOCUMENTS

CN 101620304 A 1/2010
TW 201040608 11/2010

* cited by examiner

*Primary Examiner* — Seung C Sohn
(74) *Attorney, Agent, or Firm* — Winston Hsu; Scott Margo

(57) ABSTRACT

An image sensor module includes a substrate, an image sensor mounted on the substrate, a holder position on the substrate, a lens barrel for holding a lens module and at least one spring. The spring is positioned between the holder and the lens barrel, and the spring exerts forces on the holder and the lens barrel; and the lens barrel has at least one hole, and a screw penetrates through the hole and is screwed into the holder.

7 Claims, 6 Drawing Sheets

IMAGE SENSOR MODULE AND METHOD FOR ADJUSTING FOCUS OF IMAGE SENSOR MODULE

BACKGROUND OF THE INVENTION

1. Field of the Invention

The present invention relates to an image sensor module, and more particularly, to an image sensor module and a method for adjusting a focus of the image sensor module.

2. Description of the Prior Art

Please refer to FIG. 1, which shows a prior art image sensor module 100. As shown in FIG. 1, the image sensor module 100 comprises a substrate 110, an image sensor 120, a holder 130, a lens module 140 and a lens barrel 150. When the image sensor module 100 needs to adjust the focus, a user can screw the lens barrel 150 relative the holder 130 to increase or decrease a distance between the image sensor 120 and the lens module 140 to adjust the focus of the image sensor module 100.

However, when the lens module 140 has more than one lens, such as four lenses shown in FIG. 2, the image sensor module 100 may suffer some problems when adjusting the focus. As shown in FIG. 2, when a lens barrel is screwed (i.e., a lens module 240 is rotated), some lenses of the lens module 240 may be not within a sensing region 222 of an image sensor 220, that is the image sensor 220 may not sense all light penetrating through the lenses of the lens module 240.

In addition, when a tilt problem of the lens barrel 150 occurred after the image sensor module 100 is assembled, the images sensed by the image sensor 120 may be blurred, but the image sensor module 100 shown in FIG. 1 cannot simply solve this problem.

SUMMARY OF THE INVENTION

It is therefore an objective of the present invention to provide an image sensor module and a method for adjusting a focus of the image sensor module, to solve the above-mentioned problems.

According to one embodiment of the present invention, an image sensor module comprises a substrate, an image sensor mounted on the substrate, a holder position on the substrate, a lens barrel for holding a lens module and at least one spring. The spring is positioned between the holder and the lens barrel, and the spring exerts forces on the holder and the lens barrel; and the lens barrel has at least one hole, and a screw penetrates through the hole and is screwed into a screw hole of the holder.

According to another embodiment of the present invention, a method for adjusting a focus of an image sensor module is provided, where the image sensor module comprises a substrate, an image sensor mounted on the substrate, a holder position on the substrate, a lens barrel for holding a lens module and at least one spring, where the spring is positioned between the holder and the lens barrel, and the spring exerts forces on the holder and the lens barrel; and the lens barrel has at least one hole, and a screw penetrates through the hole and is screwed into a screw hole of the holder; and the method comprises: fastening the screw or releasing the screw to adjust a distance between the holder and the lens barrel to adjust the focus of the image sensor module These and other objectives of the present invention will no doubt become obvious to those of ordinary skill in the art after reading the following detailed description of the preferred embodiment that is illustrated in the various figures and drawings.

DETAILED DESCRIPTION

Figure 1:
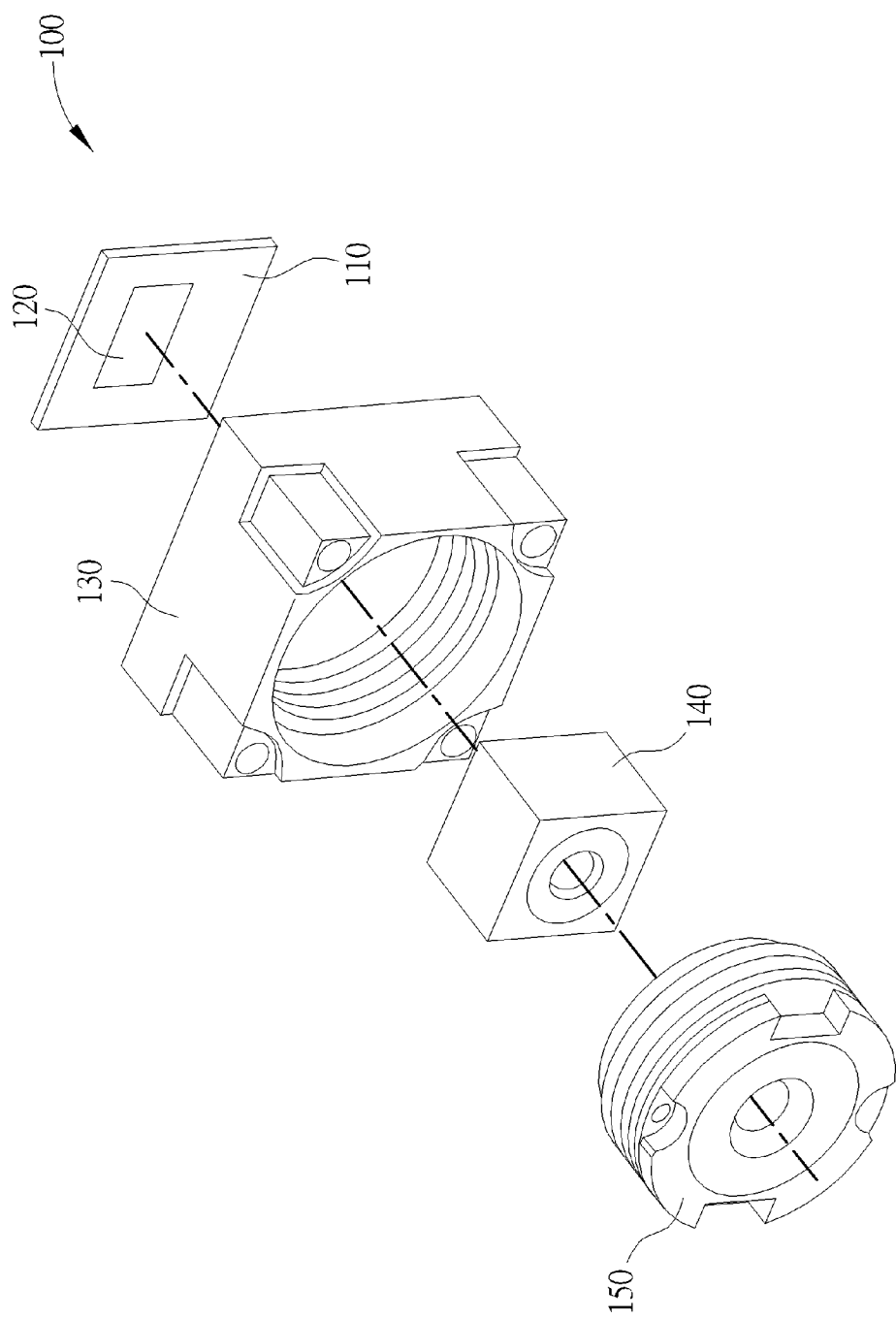
FIG. 1 shows a prior art image sensor module.
Figure 2:
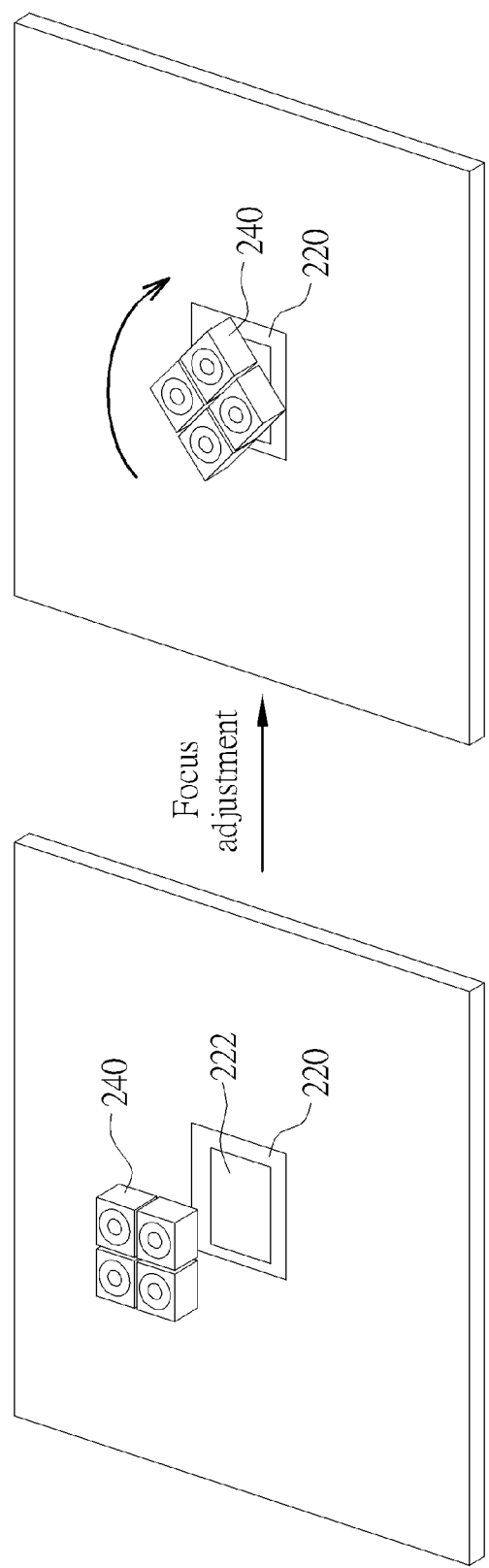
FIG. 2 shows that when a lens barrel is screwed, some lenses of the lens module may be not within a sensing region of an image sensor.
Figure 3:
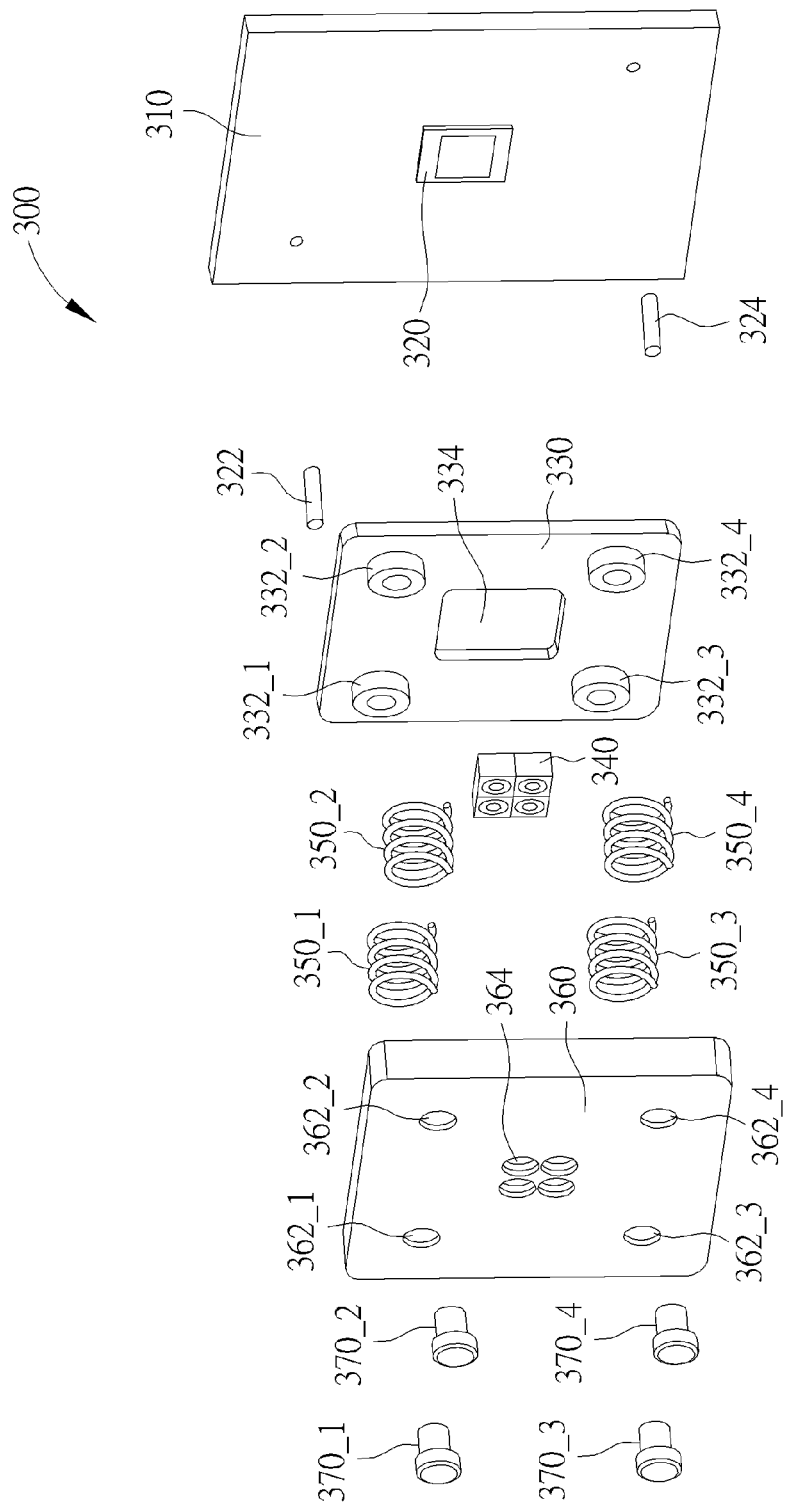
FIG. 3 is a diagram illustrating a pictorial view of an image sensor module in an unassembled configuration according to one embodiment of the present invention.
Figure 4:
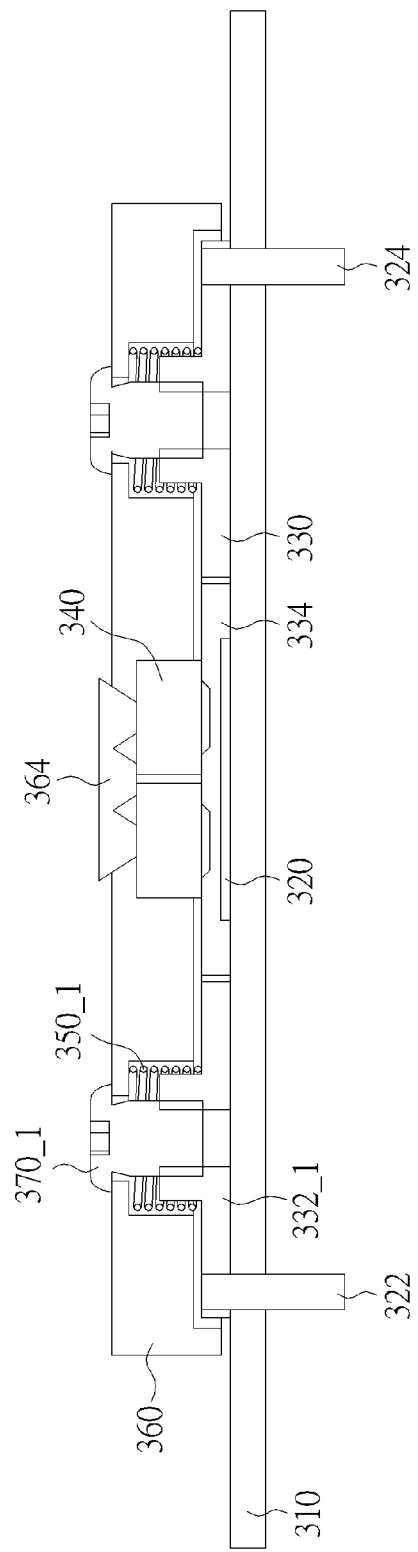
FIG. 4 is a cross-section view of the components of the image sensor module in an assembled configuration.

Please refer to FIG. 3 and FIG. 4 together, where FIG. 3 is a diagram illustrating a pictorial view of an image sensor module 300 in an unassembled configuration according to one embodiment of the present invention, and FIG. 4 is a cross-section view of the components of the image sensor module 300 in an assembled configuration. As shown in FIG. 3, the image sensor module 300 comprises a substrate 310, an image sensor 320, two locating pins 322, 324, a holder 330, a lens module 340, four springs (in this embodiment, four compression coil springs 350_1, 350_2, 350_3, 350_4), a lens barrel 360 and four screws 370_1, 370_2, 370_3 and 370_4. The image sensor is mounted on the substrate 310. The holder 330 has a window 324 and four screw holes 332_1, 332_2, 332_3, 332_4. The lens barrel 360 is used to holding the lens module 340 by adhesive, and the lens barrel 360 has four holes 362_1, 362_2, 362_3, 362_4 and an opening 364.

In this embodiment, the lens module 340 has a lens array, and the lens module 340 has four lenses. However, quantity of the lens of the lens module 340 is not a limitation of the present invention. In other embodiments, quantity of the lens of the lens module 340 can be changed due to the designer's consideration.

As shown in FIG. 3, the compression coil springs 350_1, 350_2, 350_3, 350_4 are positioned between the holder 330 and the lens barrel 360, and each screw 370_1, 370_2, 370_3 and 370_4 penetrates through the hole 362_1, 362_2, 362_3, 362_4 of the lens barrel 360 and the compression coil springs 350_1, 350_2, 350_3, 350_4, to fix the lens barrel 360 with the holder 330, where each screw is in its corresponding compression coil spring. In detail, the screw 370_1 penetrates through the hole 362_1 and the center of the compression coil spring 350_1 to connect to the screw hole 332_1, the screw 370_2 penetrates through the hole 362_2 and the center of the compression coil spring 350_2 to connect to the screw hole 332_2, the screw 370_3 penetrates through the hole 362_3 and the center of the compression coil spring 350_3 to connect to the screw hole 332_3, and the screw 370_4 penetrates through the hole 362_4 and the center of the compression coil spring 350_4 to connect to the screw hole 332_4.

Please refer to FIG. 4, after the image sensor module 300 is assembled, the compression coil springs 350_1, 350_2, 350_3 and 350_4 exerts forces upon the lens barrel 360 and the holder 330, and the lens barrel 360 can be fixed with the holder 330 because of the compressed force applied by the screw head of the screws 370_1, 370_2, 370_3 and 370_4 and the tension applied by the compression coil springs 350_1, 350_2, 350_3 and 350_4. Then the image sensor 320 can sense light from outside through the opening 364 of the lens barrel 360, the lens module 340 and the window 334 of the holder 330.

Figure 5:
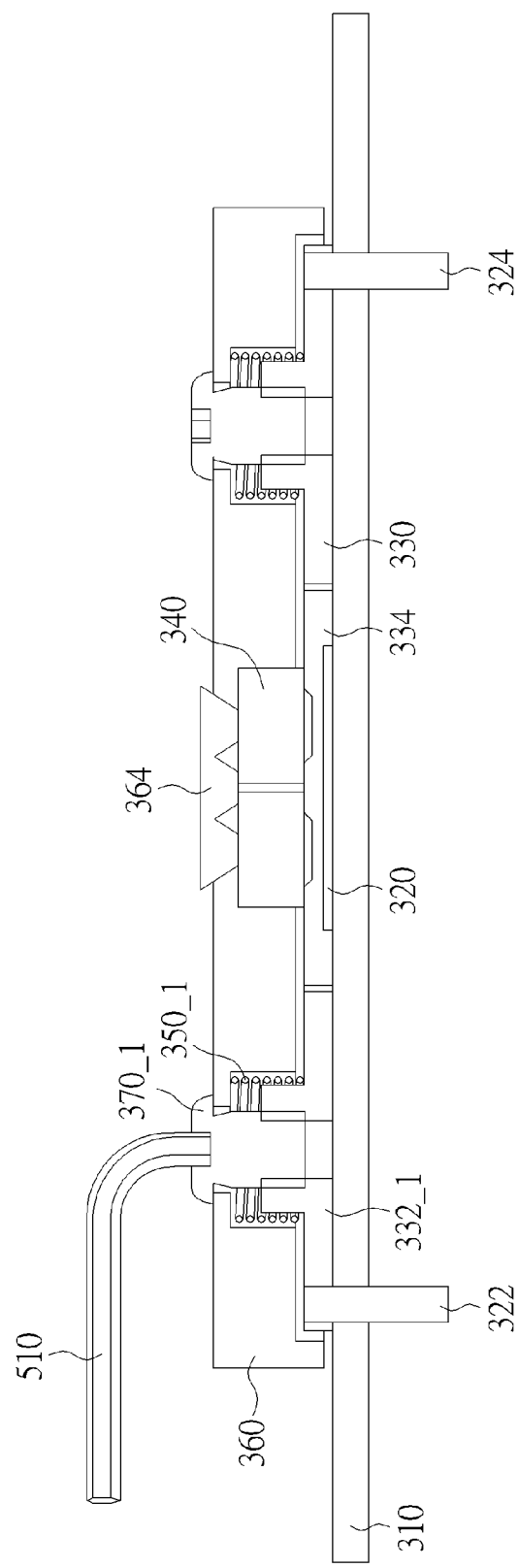
FIG. 5 shows adjusting the focus of the image sensor module by fastening or releasing the screws.

When the focus of the lens module 340 is not exactly on the image sensor 320, and the image sensor module 300 needs to adjust the focus to make images sensed by the image sensor 320 be clear. At this time, please refer to FIG. 5, the engineer can use a wrench 510 or a screwdriver to fasten or release the screws 370_1, 370_2, 370_3 and 370_4 to decrease or increase a distance between the lens barrel 360 and the holder 330 (i.e., decrease or increase a distance between the lens module 340 and the image sensor 320) to adjust the focus of the image sensor module 300. In one embodiment, the engineer can use the wrench 510 or a screwdriver to fasten the screw to shorten the distance between the holder 330 and the lens barrel 360, and to release the screw to increase the distance between the holder 330 and the lens barrel 360.

In light of above, the lens module 340 is not rotated when the focus of the image sensor module 300 is adjusted, therefore, the lenses of the lens module 340 are always within a sensing region of an image sensor 320.

In addition, when a tilt problem of the lens barrel 360 occurred after the image sensor module 300 is assembled, the engineer can simply use a wrench or a screwdriver to fasten or release one or two screws to solve the tilt problem.

In addition, in the embodiments shown in FIG. 3 and FIG. 4, there are four screws and four springs, however, it is not meant a limitation of the present invention. In other embodiments, quantity of the screws, springs and the screw holes can be varied due to the designer's consideration. For example, the image sensor module 300 shown in FIG. 3 can be modified to have only two screws (e.g. 370_1 and 370_4), and only two compression coil springs (e.g. 350_1 and 350_4). In another example, the image sensor module 300 shown in FIG. 3 can be modified to have only one screw and only one compression coil spring that are positioned near the center of the image sensor module. These alternative designs shall fall within the scope of the present invention.

Figure 6:
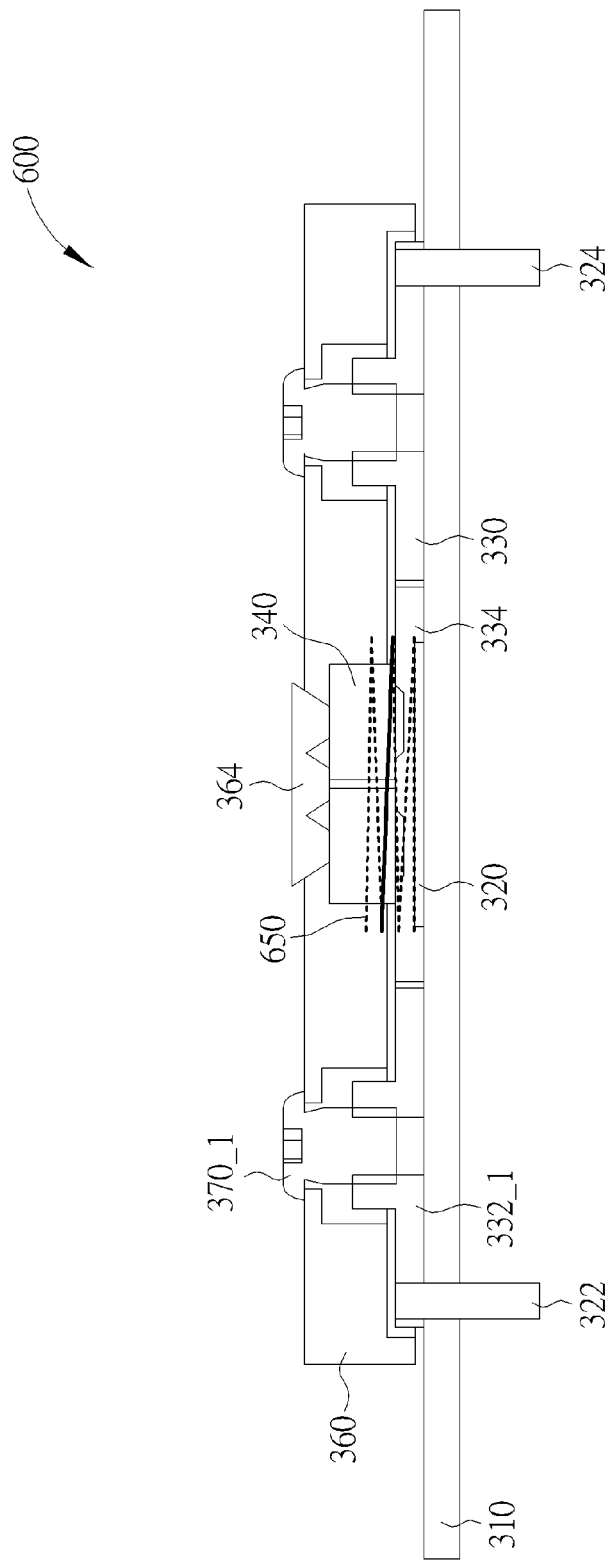
FIG. 6 is a diagram illustrating an image sensor module according to another embodiment of the present invention.

In the image sensor module 300 shown in FIG. 3, there are four compression coil springs 350_1, 350_2, 350_3, 350_4, and the screws 370_1, 370_2, 370_3 and 370_4 are in the compression coil springs 350_1, 350_2, 350_3, 350_4, respectively. However, in other embodiments, the compression coil spring (s) can be positioned in other position(s) to exert forces to the lens barrel 360 and the holder 330. Please refer to FIG. 6, which is a diagram illustrating an image sensor module 600 according to another embodiment of the present invention. The image sensor module 600 is similar to the image sensor module 300 shown in FIG. 3 but the designs of the spring. In the image sensor module 600, a compression coil spring 650 is positioned between centers of the holder 330 and the lens barrel 360, and the compression coil spring 650 exerts the forces on surrounding regions of the lens module 340.

Briefly summarized, in the image sensor module and the method for adjusting the focus of the image sensor module of the present invention, the lens module is not rotated when the focus of the image sensor module is adjusted, therefore, the lenses of the lens module are always within a sensing region of an image sensor.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An image sensor module, comprising:
   a substrate;
   an image sensor, mounted on the substrate;
   a holder, position on the substrate;
   a lens barrel, for holding a lens module; and
   at least one spring, positioned between the holder and the lens barrel, and for exerting forces on the holder and the lens barrel;
   wherein the lens barrel has at least one hole, the spring is a compression coil spring, and a screw penetrates through the hole and the compression coil spring, and is screwed into the holder.

2. The image sensor module of claim 1, wherein the lens module is a lens array module having more than one lens.

3. The image sensor module of claim 1, wherein the holder has at least one screw hole for connecting to the screw, and a distance between the holder and the lens barrel is adjusted by fastening the screw or releasing the screw.

4. The image sensor module of claim 3, wherein the distance between the holder and the lens barrel is shortened by fastening the screw, and the distance between the holder and the lens barrel is increased by releasing the screw.

5. An image sensor module, comprising:
   a substrate;
   an image sensor, mounted on the substrate;
   a holder, position on the substrate;
   a lens barrel, for holding a lens module; and
   at least one spring, positioned between the holder and the lens barrel, and for exerting forces on the holder and the lens barrel;
   wherein the lens barrel has at least one hole, and a screw penetrates through the hole and is screwed into the holder; and the image sensor module has four compression coil springs positioned between the holder and the lens barrel, the lens barrel has four holes, four screws penetrate through the four holes, respectively, to fix the lens barrel with the holder, and each of the screws is in its corresponding compression coil spring.

6. The image sensor module of claim 5, wherein the four holes are positioned on four corners of the lens barrel, respectively.

7. An image sensor module, comprising:
   a substrate;
   an image sensor, mounted on the substrate;
   a holder, position on the substrate;
   a lens barrel, for holding a lens module; and
   at least one spring, positioned between the holder and the lens barrel, and for exerting forces on the holder and the lens barrel;
   wherein the lens barrel has at least one hole, and a screw penetrates through the hole and is screwed into the holder; and the lens module is positioned on a center of the lens barrel, the spring is positioned between centers of the holder and the lens barrel, and the spring directly exerts the forces on surrounding regions of the lens module.

* * * * *